(12) United States Patent
Brunnbauer et al.

(10) Patent No.: US 8,247,897 B2
(45) Date of Patent: Aug. 21, 2012

(54) BLANK INCLUDING A COMPOSITE PANEL WITH SEMICONDUCTOR CHIPS AND PLASTIC PACKAGE MOLDING COMPOUND AND METHOD AND MOLD FOR PRODUCING THE SAME

(75) Inventors: Markus Brunnbauer, Lappersdorf (DE); Edward Fuergut, Dasing (DE)

(73) Assignee: Intel Mobile Communications GmbH, Neubiberg (DE)

( * ) Notice: Subject to any disclaimer, the term of this patent is extended or adjusted under 35 U.S.C. 154(b) by 496 days.

(21) Appl. No.: 11/686,368

(22) Filed: Mar. 15, 2007

(65) Prior Publication Data

US 2007/0216004 A1    Sep. 20, 2007

(30) Foreign Application Priority Data

Mar. 17, 2006    (DE) .......................... 10 2006 012 738

(51) Int. Cl.
*H01L 23/22* (2006.01)
(52) U.S. Cl. .................. 257/687; 257/678; 257/E23.181
(58) Field of Classification Search .......... 257/787–796, 257/678, 687, 701, E23.181
See application file for complete search history.

(56) References Cited

U.S. PATENT DOCUMENTS

| | | | |
|---|---|---|---|
| 5,963,792 A * | 10/1999 | Wensel .......................... | 438/106 |
| 6,130,115 A * | 10/2000 | Okumura et al. .............. | 438/124 |
| 6,255,722 B1 | 7/2001 | Ewer et al. | |
| 6,462,273 B1 * | 10/2002 | Corisis et al. ................. | 174/521 |
| 6,468,832 B1 * | 10/2002 | Mostafazadeh ............... | 438/112 |
| 6,624,005 B1 * | 9/2003 | DiCaprio et al. ............. | 438/113 |
| 6,943,457 B2 * | 9/2005 | Smith ........................... | 257/790 |
| 6,955,942 B2 | 10/2005 | Kobayashi et al. | |
| 7,211,879 B1 * | 5/2007 | Yang et al ..................... | 257/666 |
| 2002/0014693 A1 * | 2/2002 | Pollock ......................... | 257/724 |
| 2002/0109242 A1 * | 8/2002 | Kasuga et al. ................. | 257/787 |
| 2002/0180024 A1 * | 12/2002 | Huang et al. .................. | 257/687 |
| 2004/0207077 A1 * | 10/2004 | Leal et al. ..................... | 257/723 |
| 2004/0259291 A1 * | 12/2004 | Takiar .......................... | 438/113 |
| 2006/0278972 A1 | 12/2006 | Bauer et al. | |
| 2007/0205513 A1 * | 9/2007 | Brunnbauer et al. ......... | 257/746 |

* cited by examiner

*Primary Examiner* — Kimberly Nguyen
*Assistant Examiner* — Duy T Nguyen
(74) *Attorney, Agent, or Firm* — Edell, Shapiro & Finnan, LLC

(57) ABSTRACT

A blank and a semiconductor device are include a composite panel with semiconductor chips embedded in a plastic package molding compound. The blank includes a composite panel with semiconductor chips arranged in rows and columns in a plastic package molding compound with active upper sides of the semiconductor chips forming a coplanar surface area with the upper side of the composite panel. The blank further includes an orientation indicator impressed into the plastic package molding compound when the semiconductor chips are embedded within the molding compound.

9 Claims, 3 Drawing Sheets

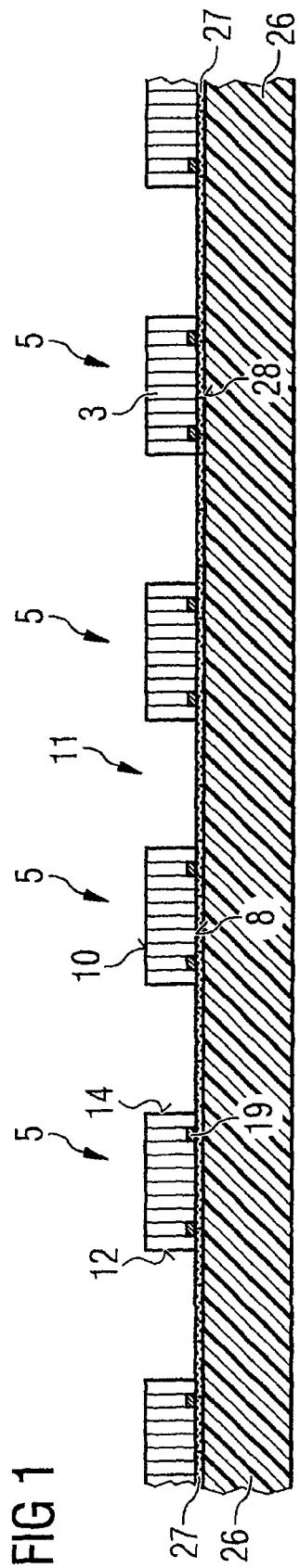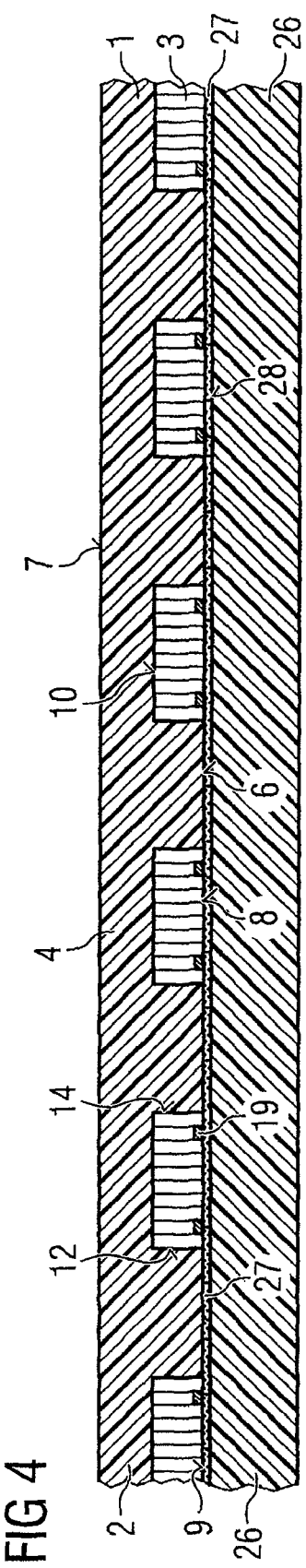

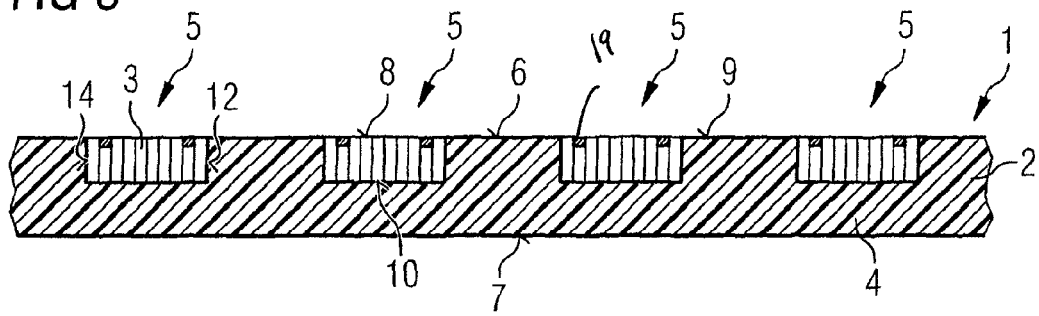
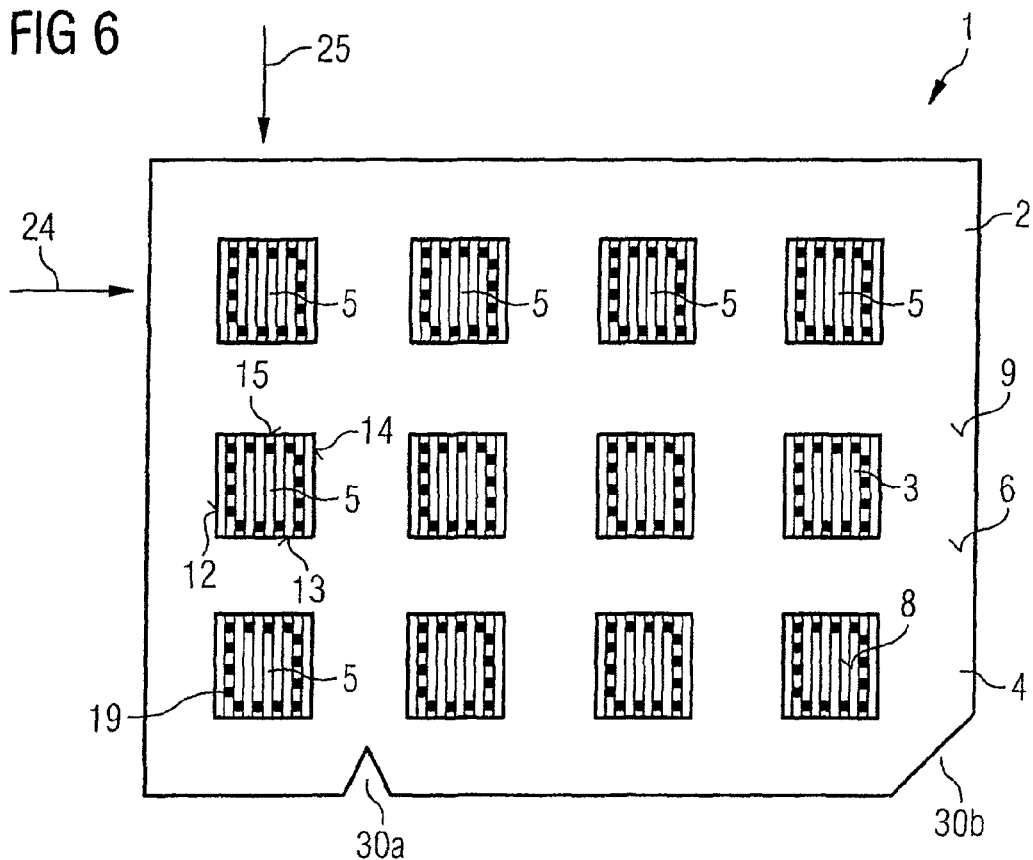

BLANK INCLUDING A COMPOSITE PANEL
WITH SEMICONDUCTOR CHIPS AND
PLASTIC PACKAGE MOLDING COMPOUND
AND METHOD AND MOLD FOR
PRODUCING THE SAME

CROSS REFERENCE TO RELATED APPLICATIONS

This application claims priority under 35 U.S.C. §119 to Application No. DE 102006012738.2 filed on Mar. 17, 2006, entitled "Blank Comprising a Composite Panel with Semiconductor Chips and Plastic Package Molding Compound and Method and Mold for Producing the Same," the entire contents of which are hereby incorporated by reference.

BACKGROUND

So-called "embedded-die" technologies, where one or more semiconductor chips are surrounded with a plastic package by techniques such as molding-in, laminating-in or building-up of the plastic layer by layer, have numerous advantages over conventional technologies, where the semiconductor chip is applied to a substrate via contacts such as solder balls and is subsequently surrounded with a plastic package.

The "embedded-die" technologies therefore allow, for example, smaller and lighter devices and make the solid connection of a number of chips in a single package and a higher density of electrical connections possible.

Moreover, the "embedded-die" technologies offer advantages in production. A method is known for producing a semiconductor device with semiconductor chips molded into a plastic molding compound to form a composite panel or a blank, the active upper sides of the semiconductor chips forming a coplanar surface area with the upper side of the composite panel, while their edges and the rear side are covered by the plastic package molding compound. A wiring structure with interconnects that are separated from one another by dielectric layers can be applied particularly well and precisely to the coplanar surface area, without warping due to different materials with different coefficients of thermal expansion.

In the case of such a composite panel or a blank, it is imperative that, for example before the photolithographic processes, a determination of the orientation is carried out. For this purpose, laser markings are usually applied to the plastic packages. Applying these laser markings, however, requires a separate process step and consequently takes a considerable amount of time and incurs additional costs.

SUMMARY

A blank and a semiconductor device including a composite panel with semiconductor chips embedded in a plastic package molding compound are described herein and also a method and a mold for producing the same. The blank includes a composite panel with semiconductor chips arranged in rows and columns in a plastic package molding compound with active upper sides of the semiconductor chips forming a coplanar surface area with the upper side of the composite panel. The blank further includes an orientation indicator impressed into the plastic package molding compound when the semiconductor chips are embedded.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

Exemplary embodiments are explained in more detail below on the basis of the accompanying figures, where:

FIG. 1 shows a schematic cross section through a carrier with applied semiconductor chips;

FIG. 4 shows a schematic cross section through the carrier with semiconductor chips embedded into a plastic package molding compound;

FIG. 5 shows a schematic cross section through a self-supporting composite panel comprising the semiconductor chips embedded into the plastic package molding compound; and FIG. 6 shows a plan view of an exemplary composite panel with an impressed orientation indicator.

DETAILED DESCRIPTION

Figure 2:
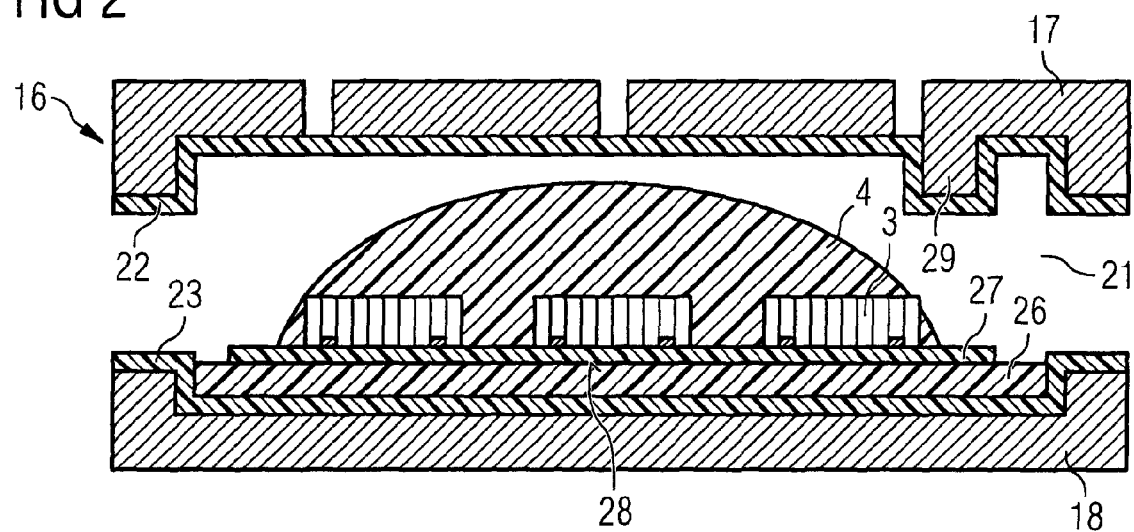
FIG. 2 shows a schematic cross section through the carrier in a mold.

Described herein is a blank comprising a composite panel which allows a determination of the orientation, but can nevertheless be produced quickly and inexpensively. In addition, a mold for producing a blank with an orientation indicator and a method for producing semiconductor devices which is particularly simple and requires few process steps is described herein.

A blank comprises a composite panel with semiconductor chips arranged in semiconductor device positions in rows and columns, the semiconductor chips including an active upper side, a rear side and edge sides. The composite panel has an upper side which forms a coplanar surface area with the active upper sides of the semiconductor chips and the plastic package molding compound embedding at least the edge sides of the semiconductor chips. A wiring structure including interconnects and comprising one or more layers may be arranged on the upper side of the composite panel. For determining the orientation, the blank comprises an orientation indicator, which is impressed into the plastic package molding compound while the semiconductor chips are being embedded.

Any feature can be applied to the blank to serve as a suitable indicator that allows an indication regarding the orientation of the blank, by breaking the symmetry of the blank. Since, typically, no further requirements are expected of the orientation indicator, a separate process step just for applying the indicator represents an unjustifiably great effort. Instead, the molding step that is carried out in any case, that is to say the surrounding of the semiconductor devices with the plastic package molding compound, should be used for applying an orientation indicator.

During the molding, in particular the compression molding that is typically used when molding in the blank, the thermosetting or thermoplastic molding material, which may, for example, be in the form of a paste or a quantity of pellets and is generally preheated, is introduced into an open, usually heated mold cavity, which is subsequently closed. Via a pressing action, the molding material is forced into and completely filling the mold. The molding material remains in the mold until it has cured. This process can be used for applying an orientation indicator, by the mold being modified in such a way that it impresses an indicator on the blank.

As already mentioned, any feature that breaks up the symmetry of the blank is suitable as an orientation indicator. The choice of a suitable orientation indicator therefore also depends on the form of the blank. The blank may have the form of a semiconductor wafer. This is advantageous because it can then be worked in further processing steps with the infrastructure that is in any case present for the working of wafers.

In the case when a blank is in wafer form, it is appropriate to use orientation indicators that are also used for the identification of semiconductor wafers, for instance, notches at the edge of the wafer and for example what are known as flats. In an alternative embodiment, the blank is rectangular. In this case, notches or indicators in the form of beveled corners are likewise suitable as orientation indicators. However, other orientation indicators, for example in the central region of the blank, are conceivable for blanks in wafer form and for rectangular blanks.

A method for producing semiconductor devices comprises: first, producing a semiconductor wafer with a plurality or multiplicity of semiconductor chip positions arranged in rows and columns and separated into a plurality or multiplicity of semiconductor chips, which have active upper sides, edge sides and rear sides. These semiconductor chips are loaded onto a carrier with their active upper sides fixed on the carrier, in rows and columns.

Subsequently, in a molding process, a plastic package molding compound is applied to the carrier, embedding the semiconductor chips with their edge sides and their rear sides into the plastic package molding compound, thereby forming a composite panel with an upper side which forms a coplanar surface area with the upper sides of the semiconductor chips and thereby impressing an orientation indicator into the plastic package molding compound.

After the plastic package molding compound cures, the carrier is removed, thereby producing a self-supporting, largely warp-free blank. A wiring structure is applied to the then accessible upper side of the composite panel and the active upper sides of the semiconductor chips via photolithographic processes. In a final step, the blank is separated into individual semiconductor devices.

The described method has the advantage that it produces the described device without applying the orientation indicator in a separate step. The production of the semiconductor devices can consequently be accomplished with less time being expended and with lower costs being incurred.

A mold for embedding semiconductor devices into a plastic package molding compound, according to the described method, comprises walls which enclose a least one mold cavity. The mold cavity comprises one or more recesses and/or elevations with the effect that the orientation indicator is impressed into the plastic package molding compound of the blank during the molding. Elevations in the walls of the mold leave a notch behind in the compression-molded blank. The notch represents a clear orientation indicator but can be applied in the edge region of the blank, so that it does not cause any problems after the blank has been divided into individual semiconductor devices, but also allows the plastic package molding compound that is marked by the notch to be removed if need be. However, other, more complicated orientation indicators and/or orientation indicators applied in the central region of the blank are also conceivable.

In the following paragraphs, exemplary embodiments of the described device and method are described in connection with the figures.

Individual production stages of a blank 1 are represented in FIGS. 1 to 5 by schematic cross sections. A first method step, in which a semiconductor wafer is first produced and subsequently divided into individual semiconductor chips, is not represented. FIG. 1 shows only the result of the subsequent method step, in which the semiconductor chips 3, for example after a prior functional test, are placed onto a carrier 26 in semiconductor device positions 5. The carrier may have the form and the dimensions of a wafer, so that an artificial wafer is produced in the steps that follow, and the artificial wafer can be processed particularly easily by automatic equipment that is present in any case. It may, however, also have a different form, for example be rectangular. Metals, silicon or polymers are suitable for example as the material for the carrier.

The semiconductor chips 3 are not arranged closely adjacent one another but instead have interspaces 11 left between the individual semiconductor chips 3 and these are later filled with plastic package molding compound to form package walls of semiconductor devices.

The semiconductor chips 3 are fixed with their active upper sides 8 and the contact areas 19 located on the latter on the upper side 28 of the carrier 26 with the aid of a double-sided adhesive film 27. In order to apply the semiconductor chips 3 in the semiconductor device positions 5, an automatic placement machine (not represented) is used, picking up the parts of a semiconductor wafer that have been separated into semiconductor chips 3 and positioning and fixing them exactly on the upper side 28 of the carrier 26 with the aid of the film 27.

Subsequently, the semiconductor chips 3 are embedded in a plastic package molding compound 4 to form chip-scale packages, as shown in FIG. 2. For this purpose, the carrier 26 with the semiconductor chips 3 fixed on it is introduced into a mold cavity 21 of a mold 16, which has a lower part 18 for receiving the carrier 26 and another part 17 for closing the mold 16. The upper part 17 of the mold 16 may be covered on its inner side with a release layer 22, the lower part 18 of the mold 16 may be covered on its inner side with a further release layer 23. The release layer 22 and/or the further release layer 23 may be, for example, a coating of the mold 16 with a suitable material for a film placed into the mold 16.

The mold 16 comprises one or more elevations 29 or recesses (not represented) for applying an orientation indicator on the blank 1, the orientation indicator being impressed into the composite panel via an elevation 29, while raised orientation indicators are created by the likewise conceivable use of a recess. However, orientation indicators which are impressed in the composite panel, and even completely penetrate it, are particularly easily identifiable by optical methods.

Figure 3:
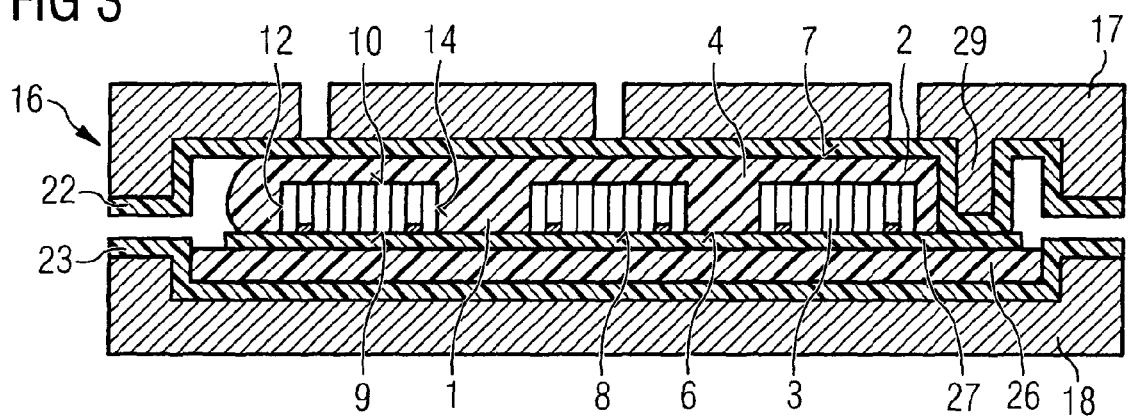
FIG. 3 shows a schematic cross section through the carrier in the mold at the end of the molding process.

The semiconductor chips 3 are embedded into a plastic package molding compound 4 via compression molding or transfer molding, a composite panel 2 comprising the plastic package molding compound 4 and the semiconductor chips 3 being formed, as shown in FIG. 3. While the composite panel 2 is located inside the mold cavity 21, it is delimited above by the release layer 22 and below by the adhesive film 27.

The elevation 29 impresses an orientation indicator into the composite panel 2, it being possible in this case for the orientation indicator to be a notch for example. The elevation 29 would then have only a small extent in the direction perpendicular to the plane of the drawing.

FIG. 4 shows a schematic cross section through the carrier 26 after applying a plastic package molding compound 4 into the interspaces 11 between the semiconductor chips 3 and to its rear sides 10. In this case, the active upper side 8 of the semiconductor chips 3 form a coplanar surface area 9 of the blank 1 with the plastic package molding compound 4.

After the plastic package molding compound 4 cures, a stable, self-supporting blank 1 with semiconductor chips 3 embedded in the plastic package molding compound 4 has been formed and the carrier 26 is removed together with the adhesive film 37. The removal of the carrier 26 may be performed by heating up the blank 1 and the carrier 26, the double-sided adhesive film 27 losing its adhesive effect and allowing the carrier 26 to be pulled off from the upper side 6 of the blank 1 without exerting any appreciable force on the blank 1. The result of this method step is shown in FIG. 5.

The active upper side 8 of the semiconductor chips 3 is then freely accessible, so that both the contact areas 19 and the remaining surface 8 of the semiconductor chips 3 and of the plastic package molding compound 4 are available for photolithographic processes. For this, it is particularly important that a determination of the orientation of the blank is possible.

Examples of conceivable orientation indicators that can easily be applied during the molding are represented in FIG. 6. FIG. 6 shows a schematic plan view of a composite panel of a blank 1. A multiplicity of semiconductor device positions 5 are arranged, with at least one semiconductor chip 3 in each case, in rows 24 and columns 25 in a plastic package molding compound 4 in such a way that the edge sides 12, 13, 14 and 15 and also the rear side 10 (not visible in FIG. 6) of the semiconductor chips 3 are in each case embedded by the plastic package molding compound 4, while the active upper side 8 (visible here) of the semiconductor chips 3 is freely accessible. The rear side 10 may be embedded in the plastic package molding compound 4, but does not have to be.

The plastic package molding compound 4 and the active upper sides 8 of the semiconductor chips 3 form a coplanar upper side 6 of the composite panel. Arranged on the coplanar upper side 6 of the composite panel, in the region of the active upper side 8 of the semiconductor chips 3, are contact areas 19, which are electrically in connection with the individual semiconductor elements of an integrated circuit of the semiconductor chip 3.

In FIG. 6, the blank comprises, for example, two orientation indicators 30a and 30b, although typically only one orientation indicator is applied. Here, a notched edge or notch 30a and a truncated or beveled corner 30b are shown as examples. In the case of a blank in wafer form, a notch 30a would likewise be a suitable orientation indicator, and a flat would also be conceivable for example.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A blank comprising:
    a composite panel including at least one orientation indicator disposed on the composite panel; and
    a plurality of semiconductor chips arranged in semiconductor device positions in rows and columns along the composite panel, wherein each of the semiconductor chips includes an active upper side, a rear side and edge sides, and the active upper sides of the semiconductor chips are substantially coplanar with an upper side of the composite panel;
    wherein the composite panel comprises a plastic package molding compound in which at least the edge and rear sides of the semiconductor chips are embedded, and the plastic package molding compound includes the at least one orientation indicator, wherein the at least one orientation indicator comprises a cut-out section at a portion of the plastic package molding compound having a constant thickness such that the plastic package molding compound including the cut-out section has a single height between opposing upper and lower sides of the plastic package molding compound, and the at least one orientation indicator is asymmetrically disposed on the blank to facilitate a determination of a plurality of different orientations of the blank via the at least one orientation indicator.

2. The blank of claim 1, wherein the blank has substantially the form and dimensions of a semiconductor wafer.

3. The blank of claim 1, wherein the at least one orientation indicator comprises a beveled corner portion of the blank.

4. The blank of claim 1, wherein the blank is substantially rectangular.

5. The blank of claim 1, wherein the orientation indicator comprises a notch located at an edge portion of the blank.

6. A mold for embedding semiconductor devices into a plastic package molding compound, the mold comprising at least one mold cavity including a recess or elevation, wherein the recess or elevation is configured to impress an orientation indicator into the plastic package molding compound when a plurality of semiconductor devices are embedded within the plastic package molding compound by the mold, wherein active upper sides of the semiconductor devices are substantially coplanar with an upper side of the plastic package molding compound, wherein the mold forms the at least one orientation indicator such that:
    the at least one orientation indicator comprises a cut-out section at a portion of the plastic package molding compound having a constant thickness and the plastic package molding compound including the cut-out section has a single height between opposing upper and lower sides of the plastic package molding compound; and
    the at least one orientation indicator is asymmetrically disposed on the plastic package molding compound to facilitate a determination of a plurality of different orientations of the plastic package molding compound via the at least one orientation indicator.

7. The blank of claim 1, wherein the active upper sides of the semiconductor chips and the upper side of the composite panel are exposed and not in contact with any other surface.

8. The blank of claim 1, wherein the orientation indicator comprises a notch located along a side portion and between two corner portions of the blank.

9. The blank of claim 8, wherein the orientation indicator further comprises a beveled corner portion of the blank.

* * * * *